US006920054B2

(12) United States Patent
Florence et al.

(10) Patent No.: US 6,920,054 B2
(45) Date of Patent: Jul. 19, 2005

(54) PULSE WIDTH MODULATED GENERATOR

(75) Inventors: Arnaud Florence, Saint Cyr sur Loire (FR); Jérôme Heurtier, Tours (FR); Franck Galtie, Veretz (FR)

(73) Assignee: STMicroelectronics S.A., Montrouge (FR)

( * ) Notice: Subject to any disclaimer, the term of this patent is extended or adjusted under 35 U.S.C. 154(b) by 14 days.

(21) Appl. No.: 10/728,582

(22) Filed: Dec. 4, 2003

(65) Prior Publication Data

US 2004/0119452 A1 Jun. 24, 2004

(30) Foreign Application Priority Data

Dec. 4, 2002 (FR) ............................................ 02 15321

(51) Int. Cl.[7] .............................. H02M 1/12; H02M 1/14
(52) U.S. Cl. ........................................ 363/41; 323/222
(58) Field of Search ..................... 363/41, 40; 323/222, 323/224, 225

(56) References Cited

U.S. PATENT DOCUMENTS

| 5,162,987 | A | * | 11/1992 | Sambhu | 700/42 |
| 5,198,785 | A | | 3/1993 | Jordan | 332/109 |
| 5,541,543 | A | | 7/1996 | Arnaud | 327/175 |
| 6,522,115 | B1 | * | 2/2003 | Greitschus | 323/288 |
| 6,650,553 | B2 | * | 11/2003 | Tsai | 363/21.07 |

* cited by examiner

*Primary Examiner*—Bao Q. Vu
(74) *Attorney, Agent, or Firm*—Lisa K. Jorgenson; Harold H. Bennett, II; Seed IP Law Group, PLLC

(57) ABSTRACT

A generator of at least one pulse width modulated signal, including: a generator of a sawtooth signal a generator of high and low reference signals defining, based on a set-point signal, a linear range of each ramp of the sawtooth signal at least one element of comparison of the sawtooth signal with each of the reference signals and at least one element of logic combination of the comparison results, providing the pulse width modulated signal.

19 Claims, 3 Drawing Sheets

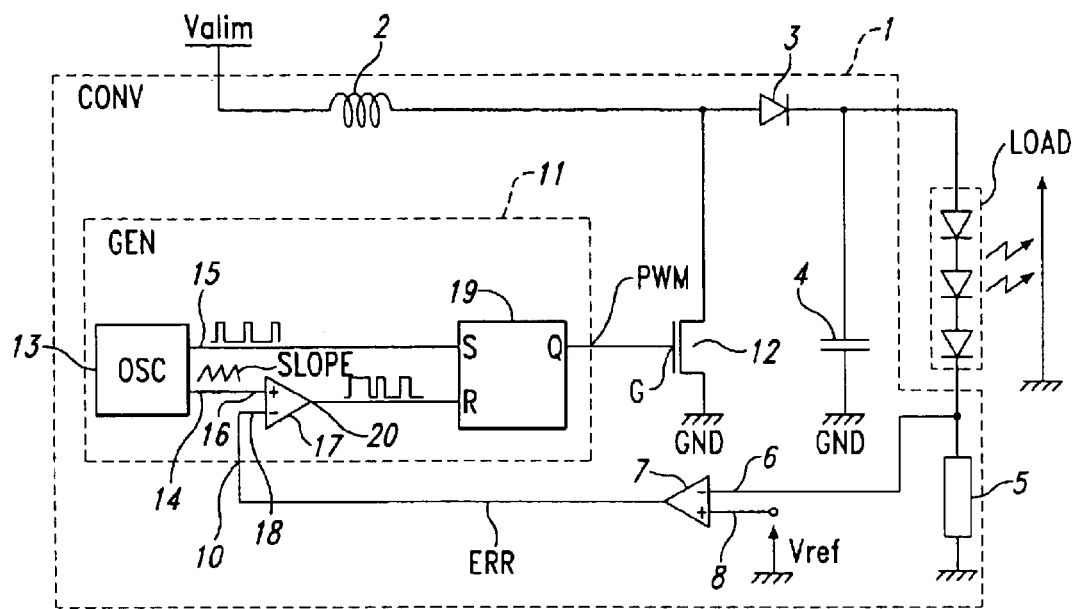
FIG. 1
*(Prior Art)*
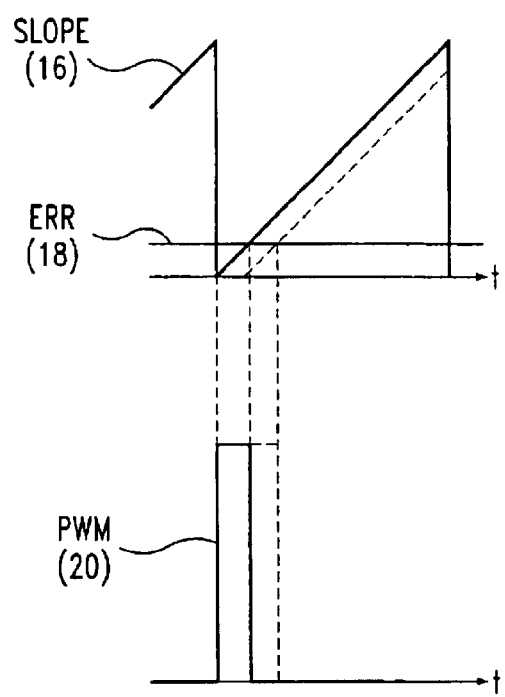
FIG. 2A
*(Prior Art)*
FIG. 2B
*(Prior Art)*

PULSE WIDTH MODULATED GENERATOR

BACKGROUND OF THE INVENTION

1. Field of the Invention

The present invention relates to the forming of a pulse width modulated generator.

2. Description of the Related Art

Pulse width modulated signals are used in many applications, for example to switch a control switch of a DC/DC voltage converter of voltage step-down or step-up type.

FIG. 1 illustrates such a step-up converter (CONV) 1 intended to provide, for a DC supply voltage Valim, a greater DC voltage Vout to a load. As an example, a load across which voltage Vout is regulated from a set value depending on a reference voltage Vref is considered. For example, the load is formed of light-emitting diodes of a backlighted screen of a mobile phone.

Converter 1 comprises, in series between a high supply rail at voltage Valim and a reference rail or ground GND, an inductance 2, a diode 3, and a capacitor 4. Intermediary diode 3 is directed to enable flowing of a current from inductance 2 to capacitor 4. The junction point of the cathode of diode 3 and of an armature of capacitor 4 forms an output terminal of converter 1 connected to an end of the load. Another end of the load is connected to reference rail GND by a read resistor 5 which belongs to the converter.

To regulate voltage Vout, the junction point of the load and of resistor 5 is connected to an inverting input (−) 6 of an operational amplifier 7 having a non-inverting input (+) 8 receiving DC voltage reference Vref. Output error signal ERR of amplifier 7 is provided to a reference input 10 of a pulse generator (GEN) 11. Resistor 5 is used as a current-to-voltage converter.

Generator 11 provides a pulse width modulated signal PWM to a control terminal of a controllable switch 12, connected between the anode of diode 3 and reference rail GND. Generally, switch 12 is a MOS transistor, the control terminal of which is its gate G.

Generator 11 typically comprises an oscillator (OSC) 13 comprising two distinct outputs 14 and 15. An output 14 of oscillator 13 provides a sawtooth signal SLOPE to the non-inverting input (+) 16 of a comparator 17. An inverting input (−) 18 of comparator 17 is connected to terminal 10 and thus receives error signal ERR provided by amplifier 7. The other output terminal 15 of oscillator 13 provides a pulse train PULSE, of frequency equal to the sawtooth frequency SLOPE, to a set input S of an RS-type electronic flip-flop 19. A reset input R of flip-flop 19 is connected to output 20 of comparator 17. Output Q of flip-flop 19 forms the output of generator 11 and provides the PWM signal to gate G.

Generator 11 thus provides a pulse width modulated signal PWM, the modulation reference ERR of which depends on the state of the voltage difference across resistor 5 of converter 1 with respect to a reference Vref. In practice, pulse width modulated signal PWM is provided on output 20 of comparator 17 and locked by flip-flop 19 to obtain an appropriate control of transistor 12.

FIGS. 2A and 2B are partial simplified timing diagrams illustrating signals SLOPE, ERR, and PWM of FIG. 1. FIG. 2A illustrates an example of the variation of signals SLOPE and ERR along time t. FIG. 2B illustrates signal PWM on output 20 resulting from the comparison of signal ERR and SLOPE of FIG. 2A. As illustrated in FIG. 2B, pulse PWM appears at the zero crossing of signal SLOPE and disappears when this signal becomes equal to signal ERR.

A disadvantage of this type of circuit is the inaccuracy of the duty cycle of signal PWM. Indeed, oscillator 13 does not provide a perfect sawtooth signal such as signal SLOPE of FIG. 2A. A real oscillator provides a signal, illustrated in dotted lines in FIG. 2A, which exhibits an offset, generally a delay, at the zero crossing. Then, as also illustrated in dotted lines in FIG. 2B, the time at which signal SLOPE becomes really equal to reference signal ERR is also offset by an absolute error existing on the entire increasing linear ramp portion of the signal. For relatively high values of the duty cycle of signal PWM, such an error is negligible. However, for small values of the duty cycle, this absolute error causes a significant increase in the duty cycle of signal PWM.

Another disadvantage is that this error is of an unknown value, uncontrollable especially since it depends on uncontrollable drifts of the manufacturing processes and since it may vary during the generator operation.

Another disadvantage of this circuit is the fact that the uncertainty about the real value of the duty cycle is further increased by the switching delays of the various circuit comparators (7, 17). Such delays are all the greater as the compared values are small (close to the level of reference rail GND). The increase is then relatively greater for small duty cycles than for relatively large duty cycles.

Such a duty cycle of increased value with respect to a necessary or desired value for a load is particularly disadvantageous in the case of portable devices supplied by a battery. Indeed, since the duty cycle corresponds to the power consumed by the battery, if it is increased, the battery discharges faster than it should.

BRIEF SUMMARY OF THE INVENTION

An embodiment of the present invention provides a pulse width modulated generator, having a precisely known duty cycle, even for small values.

An embodiment of the present invention provides a generator of at least one pulse width modulated signal having a generator of a sawtooth signal, a generator of high and low reference signals defining, based on a set-point signal, a linear range of each ramp of the sawtooth signal, a comparison element configured to compare the sawtooth signal with each of the respective reference signals, and a logic combination element configured to combine the comparison results, providing the pulse signal.

According to an embodiment of the present invention, the reference signals are symmetrical with respect to a predetermined value.

According to an embodiment of the present invention, the predetermined value is equal to half the maximum voltage value reached by the sawtooth signal.

According to an embodiment of the present invention, the sawtooth signal is of fixed frequency and amplitude.

According to an embodiment of the present invention, the generator further comprises an RS-type flip-flop having a first input receiving the output signal of the combination element and a second input directly receiving one of the signals provided by the comparison elements.

According to an embodiment of the present invention, the first input of the RS flip-flop is the set input and the second input is the reset input.

According to an embodiment of the present invention, the logic combination element comprises at least one XOR-type gate or one AND-type gate.

According to an embodiment of the present invention, the generator of the reference signals comprises an input stage receiving the set-point signal and controlling a current mirror having an output terminal providing the reference signals.

According to an embodiment of the present invention, the current mirror includes an input branch formed of a series connection, between high supply and reference rails, of a first PNP-type bipolar transistor and of a first NPN-type transistor, the base of the PNP-type transistor being interconnected to its collector, and the output branch which comprises a series connection, between the high and reference rails, of a second PNP-type transistor having its collector providing the high reference signal, of two resistors, and of a second NPN-type transistor having its collector providing the low reference signal, the bases of the PNP-type transistors being interconnected, the junction point of the resistors being connected to the output of an operational amplifier having a non-inverting input receiving the predetermined value, and having an inverting input interconnected to its output.

According to an embodiment of the present invention, the set-point signal is a regulation signal.

The present invention also provides a DC/DC voltage converter, of voltage step-up or step-down type, comprising a generator according to any of the preceding embodiments to control a cut-off switch of a supply voltage.

The foregoing features, and advantages of the present invention will be discussed in detail in the following non-limiting description of specific embodiments in connection with the accompanying drawings.

BRIEF DESCRIPTION OF THE SEVERAL VIEWS OF THE DRAWINGS

FIG. 1, previously described, schematically and partially illustrates a DC/DC converter of voltage step-up type, using a pulse width modulated generator of according to the state of the art;

FIGS. 2A and 2B, previously described, are timing diagrams illustrating signals sampled at various locations of the circuit of FIG. 1;

DETAILED DESCRIPTION OF THE INVENTION

Figure 3:
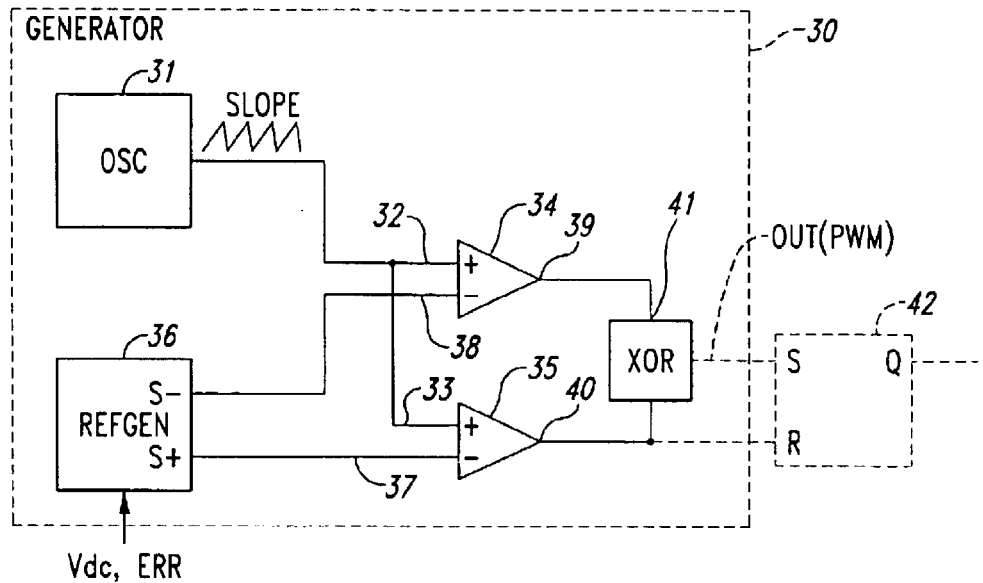
FIG. 3 partially and schematically illustrates a pulse width modulated generator according to the present invention.

FIG. 3 is a partial functional block diagram of a generator 30 of at least one pulse width modulated signal according to the present invention. Generator 30 comprises an oscillator (OSC) 31 which provides a single sawtooth signal SLOPE to respective non-inverting inputs (+) 32 and 33 of two comparators 34 and 35. Signal SLOPE is preferentially of fixed frequency and amplitude. Generator 30 also comprises a reference signal generator (REFGEN) 36 which provides two reference signals, respectively high S+ and low S−. High signal S+ is provided to an inverting input (−) 37 of any one of the two comparators, for example, comparator 35. Low reference signal S− is provided to an inverting input (−) 38 of the other comparator, for example, comparator 34. The respective output 39, 40 of each comparator 34 and 35 is provided to a respective input of a same logic combination element (XOR) 41 such as, for example, an XOR gate. Output OUT of combination element 41 forms the output of generator 30 and provides a pulse width modulated signal (PWM). The duty cycle depends on a set value Vdc or ERR provided to generator 36 and conditioning thresholds S− and S+.

The other elements shown in FIG. 3 will be detailed hereafter, after a brief description of the operating principles of the generator according to the present invention made in relation with FIGS. 4A, 4B, 4C, and 4D.

FIGS. 4A to 4D are timing diagrams partially and schematically illustrating examples of the variation along time t of signals SLOPE, S+ and S−; of the signal at output 39 of comparator 34; of the signal at output 40 of comparator 35; and of output signal PWM on point OUT of FIG. 3.

Figure 4A:
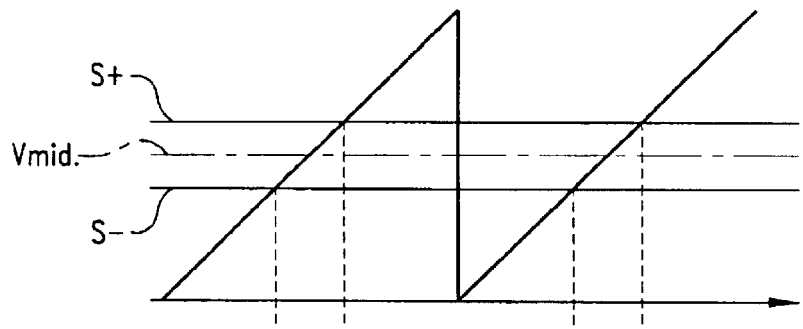
FIGS. 4A to 4D illustrate, in the form of simplified partial timing diagrams, signals sampled at various locations of the circuit of FIG. 3.
Figure 4B:
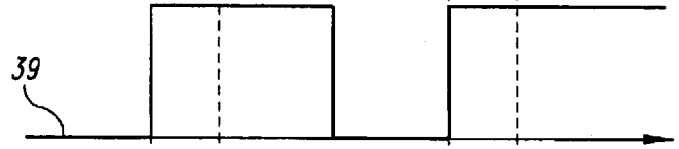
Figure 4C:
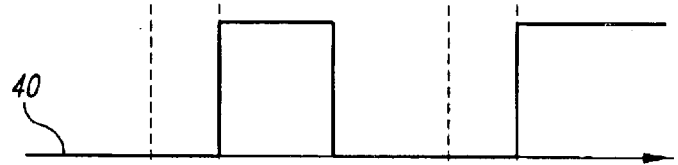
Figure 4D:
Figure 5:
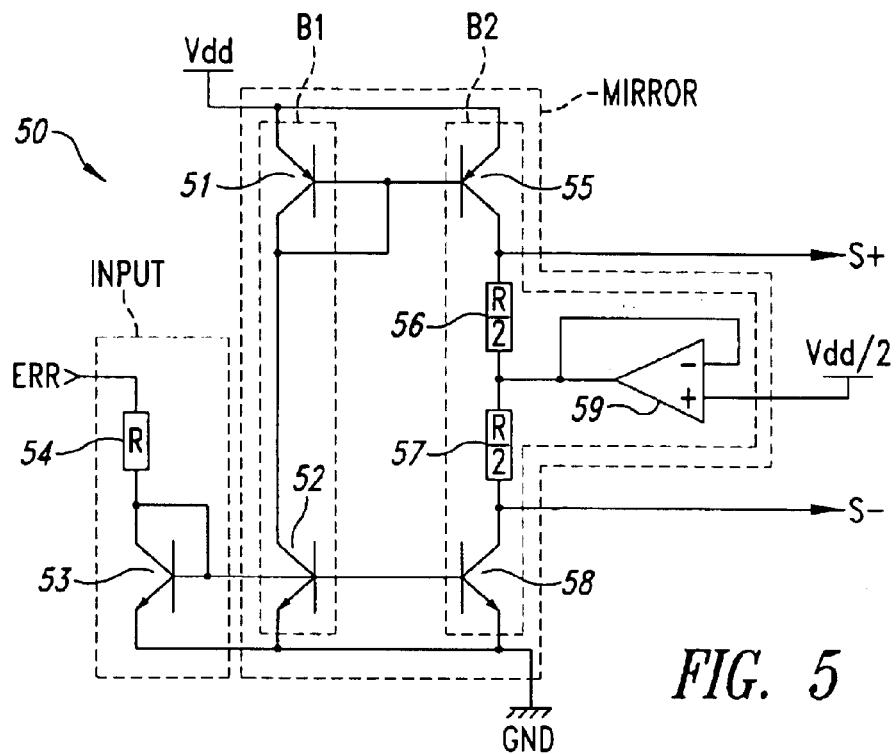
FIG. 5 partially and schematically shows an embodiment of a reference signal generator of the circuit of FIG. 3.
Figure 6:
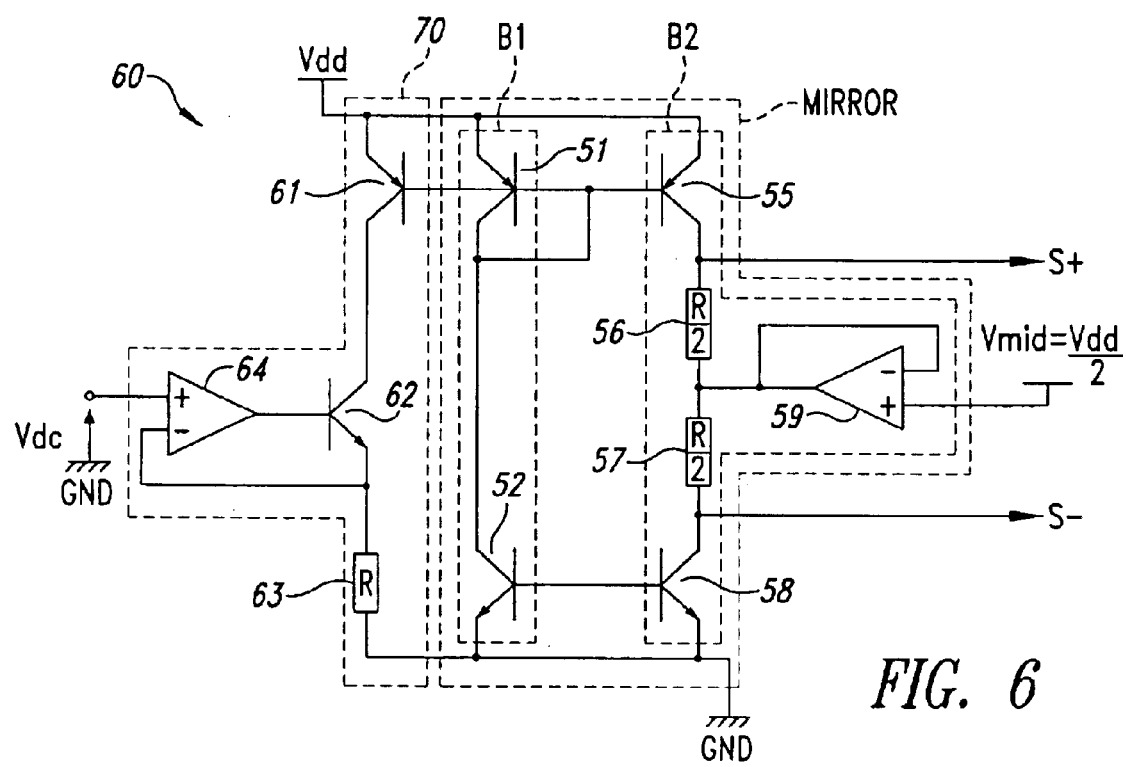
FIG. 6 schematically and partially illustrates another embodiment of the reference signal generator of FIG. 3.

According to the present invention, reference signals S+ and S− are, as will be detailed in relation with FIGS. 5 and 6, fixed according to a given set value to define, as illustrated in FIG. 4A, a linear range of signal SLOPE. This linear range is centered on a predetermined intermediary voltage Vmid. Reference signals S− and S+ are symmetrical values with respect to value Vmid. Similarly to what has been described previously in relation with comparator 17 of FIG. 1, comparators 34 and 35 of FIG. 3 provide, on their output 39 and 40, signals respectively illustrated in FIGS. 4B and 4C which are at a low level from the time of the zero crossing of signal SLOPE and which switch high as soon as signal SLOPE exceeds the corresponding respective low or high reference value S− or S+. The resulting signal PWM at output OUT of XOR gate 41 then is low while signal SLOPE is outside of the linear range defined by reference signals S− and S+ and is high as long as signal SLOPE remains within the range defined by reference signals S− and S+. The duty cycle of the obtained pulse signal PWM is thus defined by the length of the range set by reference signals S− and S+, that is, by the interval separating them.

As an alternative, an AND-type gate replaces the XOR-type gate.

An advantage of the present invention is that a generator according to the present invention is insensitive to zero crossing delays. Indeed, the value of the duty cycle is no longer set by the crossing of an absolute value, but by the length of the linear range defined by reference signals S− and S+. Thus, on a delay at the zero crossing, the resulting offset does not affect the duty cycle of signal PWM, and thus does not affect the power provided to load.

Another advantage of the present invention is that by appropriately choosing value Vmid, preferably on the order of half the extension of signal SLOPE, a same generator may be used to supply loads having any type of duty cycle, small or large.

Another advantage of the present invention is that, for small duty cycle values, the circuit is now insensitive to ground noise. Indeed, the switching of signal PWM no longer occurs on a value close to the value of reference rail GND.

Another advantage of the present invention is that oscillator 31 needs only provide a single sawtooth signal. As compared to an oscillator (13, FIG. 1) of a known pulse generator (1), it no longer provides the pulse signal (PULSE). This simplifies the manufacturing.

A pulse width modulated generator according to the present invention is likely to have a very large number of applications. For example, it may be used in DC/DC converters of voltage step-up or step-down type in portable devices such as telephones, organizers, and personal portable computers.

In some of such applications, it may however be necessary to have a synchronous signal, as described previously in relation with FIG. 1.

As illustrated in dotted lines in FIG. 3, generator 30 according to the present invention may then be completed by the adding of an output stage formed of an electronic RS flip-flop 42. An input, for example, a set input S, of flip-flop 42 is connected to an output OUT of generator 30. The other input of flip-flop 42, for example, reset input R, is connected to output 39 or 40 of one of comparators 34 and 35. Output Q of flip-flop 42 then forms the real output of the pulse generator.

In the case of the embodiment of FIG. 3 using an XOR gate as combination element 41, reset input R of flip-flop 42 is, preferably, connected to output 40 of comparator 35 receiving high reference signal S+. Thus, the flip-flop transmits signal PWM entirely. Connecting to input R output 39 of comparator 34 receiving low reference signal S- would however enable obtaining another pulse signal, corresponding to the output signal of this same comparator 34, illustrated in FIG. 4B. It is also possible to form a generator of several width-modulated signals.

It is also possible to provide output signals 39 and 40 of comparators 34 and 35 to several distinct combination elements, and thus obtain several signals having different duty cycles.

According to the present invention, the practical forming of generator REFGEN (36, FIG. 3) of high and low reference signals S+ and S- depends on the nature of the set value based on which they are generated. FIGS. 5 and 6 partially and schematically illustrate two embodiments of generator REFGEN.

FIG. 5 illustrates a generator 50 of reference signals usable according to the present invention in an application similar to that of FIG. 1, in which the set value based on which reference signals S- and S+ are generated varies based on a feedback on the load supplied by the generator, for example by means of a feedback error amplifier similar to error amplifier 7 of FIG. 1.

Generator 50 then comprises, between a high supply rail Vdd and reference rail GND, a current mirror MIRROR. An input branch B1 of the current mirror is formed of the series connection, between rail Vdd and reference rail GND, of a PNP-type bipolar transistor 51 and an NPN-type bipolar transistor 52. The base of transistor 51 is interconnected to its collector (and thus to the collector of transistor 52). The base of transistor 52 is connected to the output of an input stage formed by the base of an NPN-type transistor 53. The emitter of transistor 53 is connected to reference rail GND. The collector of transistor 53, interconnected to its base, receives a variable set value signal ERR, preferably via a resistor 54 of value R.

An output branch B2 of the mirror is formed of the series connection between the same rails Vdd and GND, of a PNP-type transistor 55, of two resistors 56 and 57, and of an NPN-type transistor 58. The base of transistor 55 is connected to the base of transistor 51. The emitter of transistor 58 is interconnected to the emitter of transistor 52 connected to reference rail GND. The values of resistors 56 and 57 are preferably equal. Preferably, they are each equal to half value R of resistor 54 of the input stage. In the case where resistor 54 is omitted (for example, if set value ERR is provided by a current source), resistors 56 and 57 are, preferably, each equal to half the input impedance of the input stage.

The junction point of resistors 56 and 57 is connected to the output of an operational amplifier 59 having a non-inverting input (+) receiving, as a reference value, predetermined value Vmid, here equal to half voltage level Vdd present on the high supply rail. The inverting input (-) of amplifier 59 is interconnected to its output. Thus, the junction point of resistors 56 and 57 of output branch B2 is locked, stabilized at predetermined value Vmid. The collector of transistor 55 provides high reference signal S+ and the collector of transistor 58 provides low reference signal S-.

The value of high signal S+ is equal to the sum of predetermined value Vmid and of the voltage drop across resistor 56. However, the value of low signal S- is equal to the difference between predetermined value Vmid and the voltage drop across resistor 57. Now, the values of the respective voltage drops across resistors 56 and 57 are equal to the product of the current running through output branch B2 and of the respective value of each of resistors 56, 57. Since current I running through output branch B2 is the copy of current I running through input branch B1, current I depends on the base control of PNP transistors 51 and 55, which depends on the value of set value ERR of the input stage. Values S- and S+ thus depend on set value ERR. Further, with equal values of resistors 56 and 57, the values of S- and S+ are symmetrical with respect to predetermined value Vmid.

It should be noted that, even if thresholds S- and S+ do not evolve exactly linearly with respect to set value ERR, this is not disturbing, since it then is an absolute error which does not vary during operation, as used to be the case for noise. Further, this error is, if need be, controllable by the tuning of the components (transistors, resistors, etc.) upon manufacturing.

FIG. 6 illustrates another embodiment of a generator of reference signals S- and S+, usable, for example, to issue a signal having a constant width modulation, that is, a constant duty cycle. Generator 60 of FIG. 6 differs from generator 50 of FIG. 5 only in input stage 70, the structure and the connection of which are different. Input stage 70 of generator 60 comprises, between supply rails Vdd and GND, a series connection of a PNP-type transistor 61, of an NPN-type transistor 62, and of a resistor 63 having a value R. The base of transistor 61 forms the output of input stage 70 and is connected to the bases of PNP-type transistors 51 and 55 of the mirror. The emitter of transistor 62, that is, the junction point of transistor 62 and of resistor 63, is connected to the inverting input (-) of an operational amplifier 64 having a non-inverting input (+) receiving a D.C. voltage set value Vdc. The output of amplifier 64 is connected to the base of transistor 62.

Preferably, for generator 50 of FIG. 5 as well as for generator 60 of FIG. 6, voltage level Vdd present on the high supply rail is equal to the maximum voltage value reached by sawtooth signal SLOPE. Thus, reference signals S- and S+ are centered on the middle of signal SLOPE, and the linear range that they define can then vary by the entire amplitude of signal SLOPE and thus the duty cycle can vary from 0 to 100%.

It should be noted that generator 60 of FIG. 6 may also be used for regulation, set value ERR being applied instead of voltage Vdc. Similarly, generator 50 of FIG. 5 may receive a fixed set value Vdc (not resulting from a feedback).

Of course, the present invention is likely to have various alterations, modifications, and improvement which will readily occur to those skilled in the art.

In particular, the present invention is likely to have a great number of applications. Thus, DC/DC converters are usable as a power supply for many devices such as portable devices, for example, telephones, organizers, or computers. For example, they are also used in light dimmers.

Further, oscillator 31 for generating sawtooth signal SLOPE may be of variable frequency and/or amplitude and may of course be inverted, that is, with decreasing ramps.

Moreover, comparators 34, 35 or operational amplifiers 59, 64 shown in the different drawings may be replaced with any element performing a same function.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

What is claimed is:

1. A generator of a pulse width modulated signal, comprising:
   a generator of a sawtooth signal;
   a generator of high and low reference signals defining, based on a set-point signal, a linear range of each ramp of the sawtooth signal;
   a comparison element configured to compare the sawtooth signal with each of the reference signals and produce comparison signals associated, respectively, with the reference signals; and
   a logic combination element configured to combine the comparison signals, thereby providing said pulse width modulated signal.

2. The generator of claim 1 wherein said high and low reference signals are symmetrical with respect to a predetermined value.

3. The generator of claim 2 wherein the predetermined value is equal to half of a maximum voltage value reached by the sawtooth signal.

4. The generator of claim 1 wherein the sawtooth signal is of fixed frequency and amplitude.

5. The generator of claim 1, further comprising an RS-type flip-flop having a first input receiving the pulse width modulated signal of said combination element and a second input directly receiving one of the comparison signals provided by said comparison element.

6. The generator of claim 5 wherein the first input is the set input and the second input is the reset input.

7. The generator of claim 1 wherein said logic combination element comprises an XOR-type gate or an AND-type gate.

8. The generator of claim 1 wherein the generator of the reference signals comprises an input stage receiving said set-point signal and controlling a current mirror having an output terminal providing said reference signals.

9. The generator of claim 8 wherein said reference signals are symmetrical with respect to a predetermined valve and the current mirror comprises:
   an input branch formed of a series connection, between high supply and reference rails, of a first PNP-type bipolar transistor and of a first NPN-type transistor, the base of the PNP-type transistor being interconnected to its collector; and
   said output branch which comprises a series connection, between said high and reference rails, of a second PNP-type transistor having its collector providing the high reference signal, of two resistors, and of a second NPN-type transistor having its collector providing the low reference signal, the bases of the first and second PNP-type transistors being interconnected, the junction point of said resistors being connected to the output of an operational amplifier having a non-inverting input receiving said predetermined value, and having an inverting input interconnected to its output.

10. The generator of claim 5 wherein said set-point signal is a regulation signal.

11. A DC/DC voltage converter, of voltage step-up or step-down type, comprising:
    a generator of a pulse width modulated signal, including:
    a generator of a sawtooth signal;
    a generator of high and low reference signals defining, based on a set-point signal, a linear range of each ramp of the sawtooth signal;
    a comparison element configured to compare the sawtooth signal with each of the reference signals and produce comparison signals associated, respectively, with the reference signals; and
    a logic combination element configured to combine the comparison signals, thereby providing said pulse width modulated signal.

12. A method for generating a pulse width modulated signal at a selected frequency, comprising:
    generating a sawtooth signal at the selected frequency;
    generating high and low reference signals having a voltage difference related to a modulating input level;
    comparing the high reference signal to the sawtooth signal to produce a first comparison signal;
    comparing the low reference signal to the sawtooth signal to produce a second comparison signal; and
    combining the first and second comparison signals to produce the pulse width modulated signal.

13. The method of claim 12 wherein the generating the high and low reference signals comprises:
    generating a fixed reference signal of a selected value;
    generating the high and low reference signals symmetrically above and below the fixed reference signal, respectively.

14. The method of claim 13 wherein the value of the fixed reference signal is selected to be approximately half a maximum value of the sawtooth signal.

15. The method of claim 12 wherein the combining step comprises establishing the width of a given pulse of the pulse width modulated signal by beginning the given pulse at a crossing of the sawtooth signal and the low reference signal and ending the given pulse at a crossing of the sawtooth signal and the high reference signal.

16. The method of claim 12 wherein the generating high and low reference signals comprises:
    inputting the modulating input to an input branch of a current mirror circuit having the input branch and an output branch, the output branch including first and second resistors coupled in series at respective first terminals and defining therebetween a reference node;
    inputting a fixed reference value to the reference node; and
    outputting the high and low reference signals from respective second terminals of the first and second resistors.

17. A device, comprising:

means for generating a sawtooth signal;

means for generating high and low reference signals having a voltage difference related to a modulating input level;

means for comparing the high reference signal to the sawtooth signal to produce a first comparison signal;

means for comparing the low reference signal to the sawtooth signal to produce a second comparison signal;

means for combining the first and second comparison signals to produce a pulse width modulated signal.

18. A device, comprising:

a generator configured to produce a sawtooth signal;

a generator configured to produce high and low reference signals having between them a voltage difference related to a modulating input level;

a circuit configured to compare the high reference signal to the sawtooth signal to produce a first comparison signal;

a circuit configured to compare the low reference signal to the sawtooth signal to produce a second comparison signal; and a logic circuit configured to combine the first and second comparison signals to produce the pulse width modulated signal.

19. The method of claim 18 wherein the high and low reference signals are equally spaced, respectively, above and below a value midpoint between maximum and minimum values of the sawtooth signal.

* * * * *